United States Patent
Fossum et al.

(10) Patent No.: US 7,009,646 B1
(45) Date of Patent: Mar. 7, 2006

(54) THREE-SIDED BUTTABLE CMOS IMAGE SENSOR

(75) Inventors: Eric R. Fossum, La Crescenta, CA (US); David Schick, Flushing, NY (US); Song Xue, Arcadia, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/211,718

(22) Filed: Dec. 14, 1998

Related U.S. Application Data

(60) Provisional application No. 60/069,700, filed on Dec. 16, 1997.

(51) Int. Cl.
  *H04N 3/14* (2006.01)
  *H04N 5/335* (2006.01)

(52) U.S. Cl. ...................... 348/294; 348/315
(58) Field of Classification Search ................ 348/294, 348/315, 332, 218.1, 248; 378/988; 250/280.1, 250/370.08, 370.09, 370.11, 363.02; 358/482, 358/483, 514
See application file for complete search history.

(56) References Cited

U.S. PATENT DOCUMENTS

| | | | | |
|---|---|---|---|---|
| 5,321,303 | A * | 6/1994 | Kawahara et al. | 242/375 |
| 5,398,275 | A * | 3/1995 | Catalin | 378/98.8 |
| 5,510,623 | A * | 4/1996 | Sayag et al. | 250/370.11 |
| 5,629,524 | A * | 5/1997 | Stettner et al. | 250/370.09 |
| 5,834,782 | A * | 11/1998 | Schick et al. | 250/370.11 |
| 5,883,830 | A * | 3/1999 | Hirt et al. | 365/185.03 |
| 5,886,353 | A * | 3/1999 | Spivey et al. | 250/370.09 |
| 5,937,027 | A * | 8/1999 | Thevenin et al. | 378/98.8 |
| 5,990,503 | A * | 11/1999 | Ingram et al. | 257/236 |
| 6,115,066 | A * | 9/2000 | Gowda et al. | 348/308 |
| 6,276,605 | B1 * | 8/2001 | Olmstead et al. | 235/462.41 |
| 6,307,393 | B1 * | 10/2001 | Shimura | 324/765 |
| 6,456,324 | B1 * | 9/2002 | Yamada et al. | 348/246 |
| 2002/0000549 | A1 * | 1/2002 | Spartiotis et al. | 257/21 |

* cited by examiner

*Primary Examiner*—David L. Ometz
*Assistant Examiner*—Yogesh Aggarwal
(74) *Attorney, Agent, or Firm*—Dickstein Shapiro Morin & Oshinsky LLP

(57) ABSTRACT

An image sensor chip is formed with the image sensor abutting up to three edges of the chip. Certain parts of the row logic which are required to be adjacent to each of the rows are placed into the array, in place of certain pixels of the array. Those missing pixels are then interpolated.

19 Claims, 2 Drawing Sheets

THREE-SIDED BUTTABLE CMOS IMAGE SENSOR

CROSS REFERENCE TO RELATED APPLICATIONS

This application claims the benefit of U.S. Provisional Application Ser. No. 60/069,700, filed on Dec. 16, 1997, which is incorporated herein by reference.

BACKGROUND

Each chip producer, or "foundry", often has its own set of rules regarding the sizes of chips that can be made in that foundry. A common limit is, for example, 20×20 mm$^2$. It is relatively difficult to form a large format image sensor, i.e., one larger than that.

Active pixel sensors have integrated amplifiers and other logic formed on the same substrate with the image sensor chip. This obviates certain problems that are associated with charge-coupled devices. The typical active pixel sensor chip has logic along at least two edges of the chip. The other edges of the chip are typically formed with "guard rings" around the edge of the image sensor.

SUMMARY

According to this system as disclosed herein, a large format image sensor is formed from multiple, smaller, sensor chips. These chips are preferably active pixel sensors that require logic on chip to be associated with the pixels of the image sensor.

Certain parts of the control structure, e.g., the row addressing mechanism, needs to be individually associated with the rows of the image sensor. In a typical active pixel sensor, these parts were located along certain edges of the chip to avoid the otherwise need to run a large number of lines across the image sensor to the rows. Other such structure can include a buffer to sample and hold results from the pixels, and other associated row structure.

Previous active pixel image sensors formed a continuous rectangle at some area on the chip. At least two of the other edges were masked by the support circuitry.

The presently-disclosed system goes against this established teaching. The chip driver circuitry is formed into the shape of two pixel pitches. The circuitry placed in a central, adjacent two columns in the image sensor. This leaves three sides of the sensor array being close to the edge of the chip, and hence buttable to other similar chips. The multiple butted chip assembly is used to obtain a large format image.

The missing two pixels in the center of the array are interpolated from the neighboring sensor signals by using standard software.

BRIEF DESCRIPTION OF THE DRAWINGS

These and other aspects of the invention will now be described with reference to the attached drawings, in which.

DESCRIPTION OF THE PREFERRED EMBODIMENT

Figure 1:
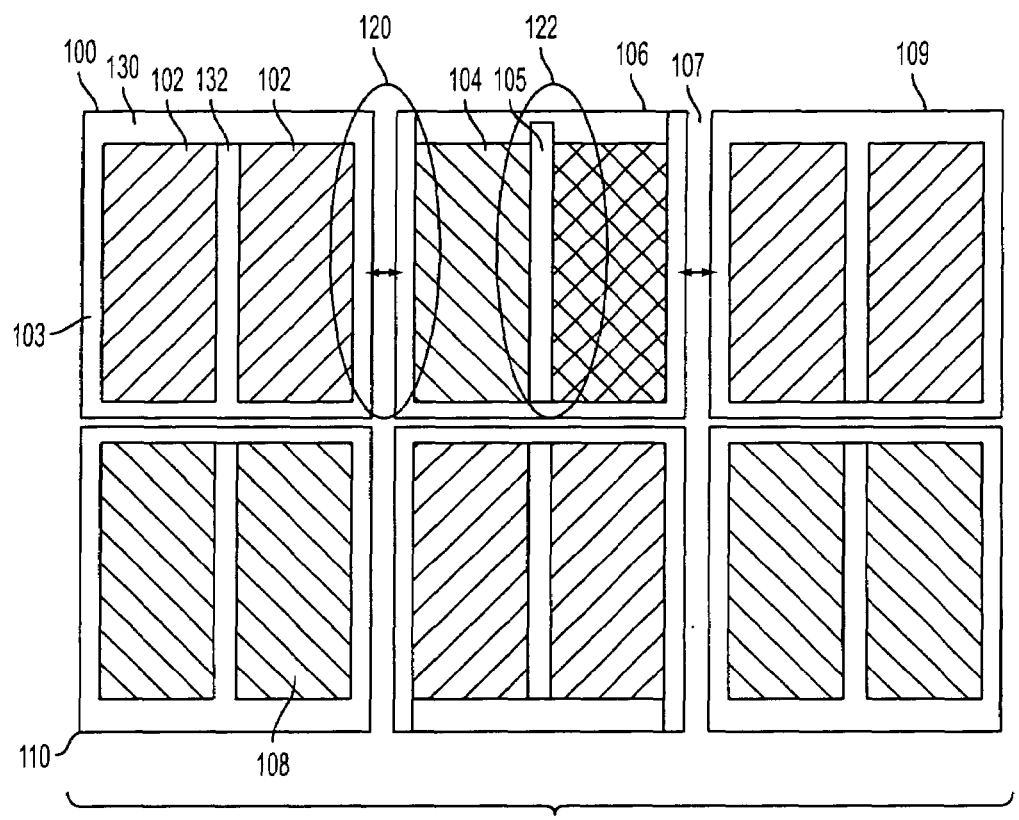
FIG. 1 shows a preferred embodiment with a plurality of butted chips.

An image sensor of the preferred embodiment is shown in FIG. 1.

FIG. 1 shows six of the specially-configured image sensor chips butted against each other. Each chip is preferably rectangular, although more generally, each of the chips needs to have a first set of parallel edges, and a second set of parallel edges. Each of the chips has an image sensor portion and a control portion. The control portion includes a centralized control portion 130 adjacent a blocked edge of the chip, and a row-local control portion 132. The row-local control portion 132 runs up the center of the image sensor area 102, masking a central two pixels of the image sensor.

The image sensor portions 102 of the various separated chips are shown hatched in FIG. 1. Each image sensor is surrounded by a guard ring 103 that protects the image sensor, and biases the image sensor portion as appropriate. The guard ring is typically about 40 μm in size.

There can be a small space 107 between the two adjacent chips 106, 109 due to the roughness of the edges. The small space is typically of the order of 1 μm.

Hence, the adjacent image sensor areas abut against each other with a separation equal to two guard rings (e.g., 80 μm), and the roughness space. If 40 μm pixels are used, then the distance between the adjacent image sensor areas is within 2–4 pixels. This distance between adjacent image sensor areas is preferably small enough that the missing pixels can be interpolated using standard missing pixel interpolation techniques. Preferably, the distance is less than 2 pixels.

Similarly, image sensor area 102 also abuts against image sensor area 108 of chip 110. As can be seen, the image sensor areas of each of the chips abut against each other.

Figure 2:
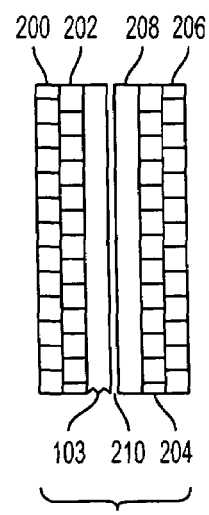
FIG. 2 shows a close up of the butted area.

FIG. 2 shows a close up in the area 120. The pixel columns 200 and 202 are located in the chip 100, as is the guard ring 103. The pixel columns 204 and 206, and the guard ring 208, are located in the chip 106. A small space 210 is located between the chips.

Generically, the image sensor should extend up to the edge, which means that no circuitry other than the guard ring is formed between the image sensor and the edge of the substrate. More preferably, the image sensor comes within 1 pixel pitch of the edge, thereby allowing interpolation to reconstruct any missing pixels.

Hence, the pixels 204 are adjacent pixels 202 separated by a space that is preferably less than one–two pixels wide including guard rings 103, 208 and space 210. The array of image sensors 99 therefore forms a system where each pixel is separated from each adjacent pixel in the adjacent image sensor by an amount that is small enough to allow interpolation of the missing space, to thereby obtain an uninterrupted image.

Figure 3:
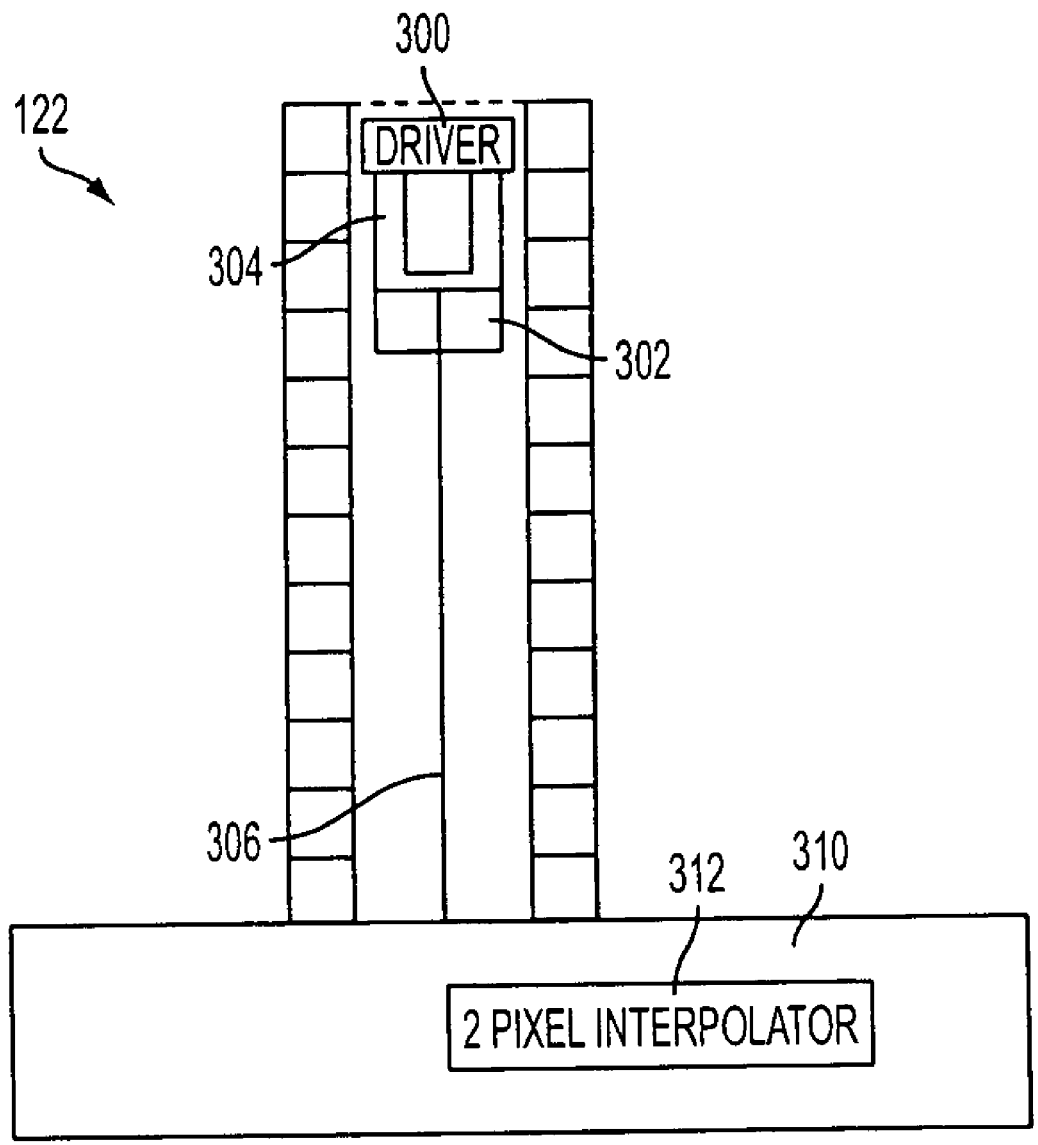
FIG. 3 shows the layout of the driver circuit.

FIG. 3 shows a close up of the area 122 in FIG. 1. The center two pixels of the image sensor include drivers 300, 302 for each of the pixel rows. These can be bit decoders to select the rows, or shift registers which select one row after another.

SRAM 304 stores temporary results, and also buffers the information as needed. Connections 306 can couple commands to the row circuitry. The overall chip driver 310 can be the same as conventional, including A/D converters for each column and the like. Element 312 also preferably includes a two-pixel interpolator that is used to interpolate for the missing pixels at areas 105 and 107 and includes pixel interpolation at space 210 caused by rough edges of the butted image sensors. Pixel interpolation is well known in the art, and is described, for example, in U.S. Pat. No. 4,816,923. More preferably, the pixel interpolation is done in software.

Although only a few embodiments have been described in detail above, other embodiments are contemplated and are intended to be encompassed within the following claims. For example, the row support circuitry can be different in shape than the described system. In addition, other modifications are contemplated and are also intended to be covered. For example, while this system suggests the row-drivers being in the center of the image sensor, they could be off center in a location, for example, that is statistically less likely to matter in the final image. Center is preferred, since this equally spaces the pixel gaps between chips and in the chip center.

What is claimed is:

1. A CMOS image sensor circuit, comprising:
a CMOS image sensor chip comprising an image sensor portion comprising an array of pixels arranged in rows and columns, and a control portion comprising image sensor logic, said image sensor logic being electrically connected to said image sensor portion, said image sensor logic including row logic associated with each of said rows individually, and chip logic associated with parts of said image sensor portion other than said rows individually, said image sensor portion having a first area and a second area;
said chip being formed to have at least a first set of parallel edges including a first edge and a second edge, and a second set of parallel edges, different than said first set of parallel edges, said second set of parallel edges including a third edge and a fourth edge;
said image sensor portion including imaging pixels extending between said first edge, said second edge, and said third edge, such that imaging pixels of said first area of said image sensor portion are adjacent said first edge and said third edge of said chip and imaging pixels of said second area of said image sensor portion are adjacent said second edge and said third edge of said chip;
said row logic being physically located inside said image sensor portion in place of a plurality of pixels of the array forming said image sensor portion; and
a pixel interpolator and said chip driver circuitry located between said first area and said second area of said image sensor portion and said fourth edge of said chip.

2. A circuit as in claim 1 wherein said row logic is formed in place of two columns of the array forming the image sensor portion.

3. A circuit as in claim 1 wherein said image sensor portion extends within two pixel pitches of said first, second, and third edges of the chip.

4. A circuit as in claim 3 wherein said first and second edges are perpendicular to said third and fourth edges.

5. A circuit as in claim 1 wherein said pixel interpolater operates to interpolate pixels which would have been active in areas of said image sensor portions taken up by said row logic and by space between said CMOS image sensor portions.

6. A circuit as in claim 1 wherein said row logic is in the center of the plurality of pixels forming the image sensor portion.

7. A circuit as in claim 1, further comprising a guard ring formed around the image sensor portion.

8. A method of capturing an image, comprising:
providing at least two image sensor chips, each chip having first and second parallel edges, a third edge aligned transverse to said first and second edges, and an image sensor array of imaging pixels that comes within two pixel pitches of said first, second, and third edges, and includes a control portion with row selecting logic in place of a plurality of central pixels of the image sensor array between said first and second edges; abutting said image sensor chips along at least a respective one of said first and second edges; and
interpolating missing pixels on said chips, the missing pixels being caused by both said row select logic and by spaces between pixel pitches along abutted edges of said image sensor chips.

9. A CMOS imager, comprising:
a first CMOS image sensor chip having an image sensor portion arranged in an array of rows and columns, said first CMOS image sensor chip formed to have at least a first set of parallel edges including a first edge and a second edge, and a second set of parallel edges, different than said first set of parallel edges, said second set of parallel edges including a third edge aligned transverse to said first and second edges; and
said first CMOS image sensor chip having a control portion and a centralized row-local control portion, said centralized row-local control portion being physically located inside said image sensor portion in place of a plurality of pixels of the array forming said CMOS image sensor portion and thereby forming at least two sensor areas including a first sensor area extending to within a few pixel pitches of said first and third edges, and a second area extending to within a few pixel pitches of said second and third edges, said control portion including a pixel interpolator located between said at least two image sensor areas and one of said edges of said first CMOS image sensor chip.

10. The CMOS imager according to claim 9, further comprising a second CMOS image sensor chip configured correspondingly to said first CMOS image sensor chip and abutted to one of said edges of said first CMOS image sensor chip.

11. A method of fabricating a CMOS imager comprising:
fabricating at least two CMOS image sensor chips having an image sensor portion arranged in an array of rows and columns, each of said at least two CMOS image sensor chips formed to have at least a first set of parallel edges including a first edge and a second edge, and a second set of parallel edges, different than said first set of parallel edges, said second set of parallel edges including a third edge and a fourth edge, said at least two image sensor chips each having a control portion and a centralized row-local control portion, said centralized row-local control portion being physically located inside said image sensor portion in place of a plurality of pixels of the array formed on said image sensor chip and thereby forming at least two image sensor areas for each of said at least two CMOS image sensor chips, said control portion including a pixel interpolator located between said at least two image sensor areas and one of said edges of said image sensor;
abutting said at least two CMOS image sensor chips together; and
integrating said control portions of said at least two CMOS image sensor chips such that said at least two CMOS image chips function as a single CMOS imager.

12. The method of fabricating according to claim 11, further comprising interpolating, using said pixel interpolator of said control portion, missing pixels caused by said centralized row-local control portion and by spaces between said at least two image sensor areas.

13. A CMOS image sensor circuit, comprising:
a first CMOS image sensor chip having an image sensor portion arranged in an array of pixels of rows and columns, and image sensor logic on said chip, said image sensor logic being electrically connected to said image sensor portion, said image sensor logic including row logic associated with each of said rows individually, and chip logic associated with parts of said image sensor portion other than said rows individually, said image sensor portion having a first area and a second area;
said first CMOS image sensor chip formed to have at least a first set of parallel edges including a first edge and a second edge, and a second set of parallel edges, different than said first set of parallel edges, said second set of parallel edges including a third edge and a fourth edge;
said first CMOS image sensor portion extending between said first edge, said second edge, and said third edge, such that said first area of said image sensor portion is adjacent said first edge and said third edge of said image sensor chip and said second area of said image sensor portion is adjacent said second edge and said third edge of said first CMOS image sensor chip;
said row logic being physically located inside said image sensor portion in place of a plurality of pixels of the array forming said image sensor portion;
a pixel interpolator and said chip driver circuitry located between said first portion and said second portion of said image sensor portion and said fourth edge of said image sensor chip; and
a second CMOS image sensor chip configured correspondingly to said first CMOS image sensor chip and abutted to one of said edges of said first CMOS image sensor chip.

14. A method of fabricating a CMOS imager comprising fabricating at least two CMOS image sensor chips having an image sensor portion arranged in an array of rows and columns, each of said at least two CMOS image sensor chips formed to have at least a first set of parallel edges including a first edge and a second edge, said a second set of parallel edges, different than said first set of parallel edges, said second set of parallel edges including a third edge and a fourth edge, each of said at least two image sensor chips having a control portion and a centralized row-local control portion, said centralized row-local control portion being physically located inside said image sensor portion in place of a plurality of pixels of the array formed on said image sensor chip and thereby forming at least two active image sensor areas in each of said at least two CMOS image sensor chips, each said control portion respectively including a pixel interpolator located between said at least two image sensor areas and one of said edges of said image sensor chip.

15. The method according to claim 14, further comprising:
abutting said at least two CMOS image sensor chips together; and
integrating said control portions of said at least two CMOS image sensor chips such that said at least two CMOS image sensor chips function as a single CMOS imager.

16. A circuit as in claim 1 wherein said row logic masks two columns of the array forming the image sensor portion.

17. A circuit as in claim 1 wherein said row logic is non-photosensitive.

18. A circuit as in claim 1 wherein said row logic includes row drivers and memory.

19. The CMOS imager according to claim 10, wherein the first and second CMOS image sensors are co-planar.

* * * * *

UNITED STATES PATENT AND TRADEMARK OFFICE
CERTIFICATE OF CORRECTION

PATENT NO. : 7,009,646 B1 Page 1 of 1
DATED : March 7, 2006
INVENTOR(S) : Eric R. Fossum et al.

It is certified that error appears in the above-identified patent and that said Letters Patent is hereby corrected as shown below:

Column 1,
Line 50, "circuitry placed in a central," should read -- circuitry is placed in a central location, --;

Column 2,
Line 47, "202 separated" should read -- 202 or separated --.

Signed and Sealed this

Thirteenth Day of June, 2006

JON W. DUDAS
*Director of the United States Patent and Trademark Office*